(12) United States Patent
Kishimoto et al.

(10) Patent No.: US 10,545,239 B2
(45) Date of Patent: Jan. 28, 2020

(54) DISTANCE-MEASURING IMAGING DEVICE AND SOLID-STATE IMAGING DEVICE

(71) Applicant: Panasonic Intellectual Property Management Co., Ltd., Osaka (JP)

(72) Inventors: Masaya Kishimoto, Osaka (JP); Haruka Takano, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 90 days.

(21) Appl. No.: 15/882,493

(22) Filed: Jan. 29, 2018

(65) Prior Publication Data

US 2018/0149750 A1 May 31, 2018

Related U.S. Application Data

(63) Continuation of application No. PCT/JP2016/002485, filed on May 23, 2016.

(30) Foreign Application Priority Data

Jul. 31, 2015 (JP) .................................. 2015-152764

(51) Int. Cl.
*G01S 17/10* (2006.01)
*G01S 17/89* (2006.01)
(Continued)

(52) U.S. Cl.
CPC .............. *G01S 17/10* (2013.01); *G01S 17/89* (2013.01); *H04N 5/35581* (2013.01); *H04N 5/372* (2013.01); *H04N 5/374* (2013.01)

(58) Field of Classification Search
CPC ........ G01S 17/10; G01S 17/89; G01S 7/4865; H04N 5/35581; H04N 5/3535;
(Continued)

(56) References Cited

U.S. PATENT DOCUMENTS

| 7,791,715 B1 | 9/2010 | Bamji |
| 2005/0088644 A1* | 4/2005 | Morcom ................. G01S 7/487 356/10 |

(Continued)

FOREIGN PATENT DOCUMENTS

| EP | 2 402 783 A1 | 1/2012 |
| JP | 2004-294420 A | 10/2004 |

(Continued)

OTHER PUBLICATIONS

Extended European Search Report issued in Application No. 16832443.2 dated Jul. 12, 2018.

(Continued)

*Primary Examiner* — Tung T Vo
(74) *Attorney, Agent, or Firm* — McDermott Will & Emery LLP

(57) ABSTRACT

A distance-measuring imaging device includes: a drive controller that outputs a light emission signal and an exposure signal; a light source; a solid-state imager that performs exposure to reflected light; and a TOF calculator that calculates a distance to an object using an imaging signal. The drive controller: cyclically outputs a first exposure signal group in which, before an exposure period of one exposure signal ends, an exposure period of at least one other exposure signal starts; and outputs a second exposure signal group having a dead zone period during which all exposure signals are in a non-exposure period. The TOF calculator calculates a first distance value using a first imaging signal obtained according to the first exposure signal group, calculates a second distance value using a second imaging signal obtained according to the second exposure signal group, and calculates the distance based on the first and second distance values.

10 Claims, 14 Drawing Sheets

(51) Int. Cl.
*H04N 5/355* (2011.01)
*H04N 5/372* (2011.01)
*H04N 5/374* (2011.01)

(58) Field of Classification Search
CPC .. H04N 5/372; H04N 5/374; H01L 27/14643; H01L 27/14831
USPC .......................................................... 348/139
See application file for complete search history.

(56) References Cited

U.S. PATENT DOCUMENTS

| | | | |
|---|---|---|---|
| 2006/0192938 | A1 | 8/2006 | Kawahito |
| 2008/0237445 | A1* | 10/2008 | Ikeno ................... G01S 17/32 250/205 |
| 2011/0141228 | A1* | 6/2011 | Shimada ................ G03B 37/00 348/36 |
| 2011/0187826 | A1* | 8/2011 | Felzenshtein ............ G01C 3/08 348/46 |
| 2012/0050716 | A1 | 3/2012 | Murakami et al. |
| 2016/0097841 | A1 | 4/2016 | Otani et al. |
| 2016/0295193 | A1* | 10/2016 | Van Nieuwenhove ..................... H04N 13/122 |
| 2016/0334508 | A1* | 11/2016 | Hall ...................... G01S 7/4811 |
| 2017/0115395 | A1* | 4/2017 | Grauer ................. G01S 7/4865 |

FOREIGN PATENT DOCUMENTS

| | | |
|---|---|---|
| JP | 2010-256291 A | 11/2010 |
| JP | 2013-076645 A | 4/2013 |
| JP | 2013-538342 A | 10/2013 |
| WO | 2012/012607 A2 | 1/2012 |
| WO | 2014/207992 A1 | 12/2014 |

OTHER PUBLICATIONS

International Search Report issued in Application No. PCT/JP2016/002485 dated Aug. 16, 2016, with English translation.

* cited by examiner

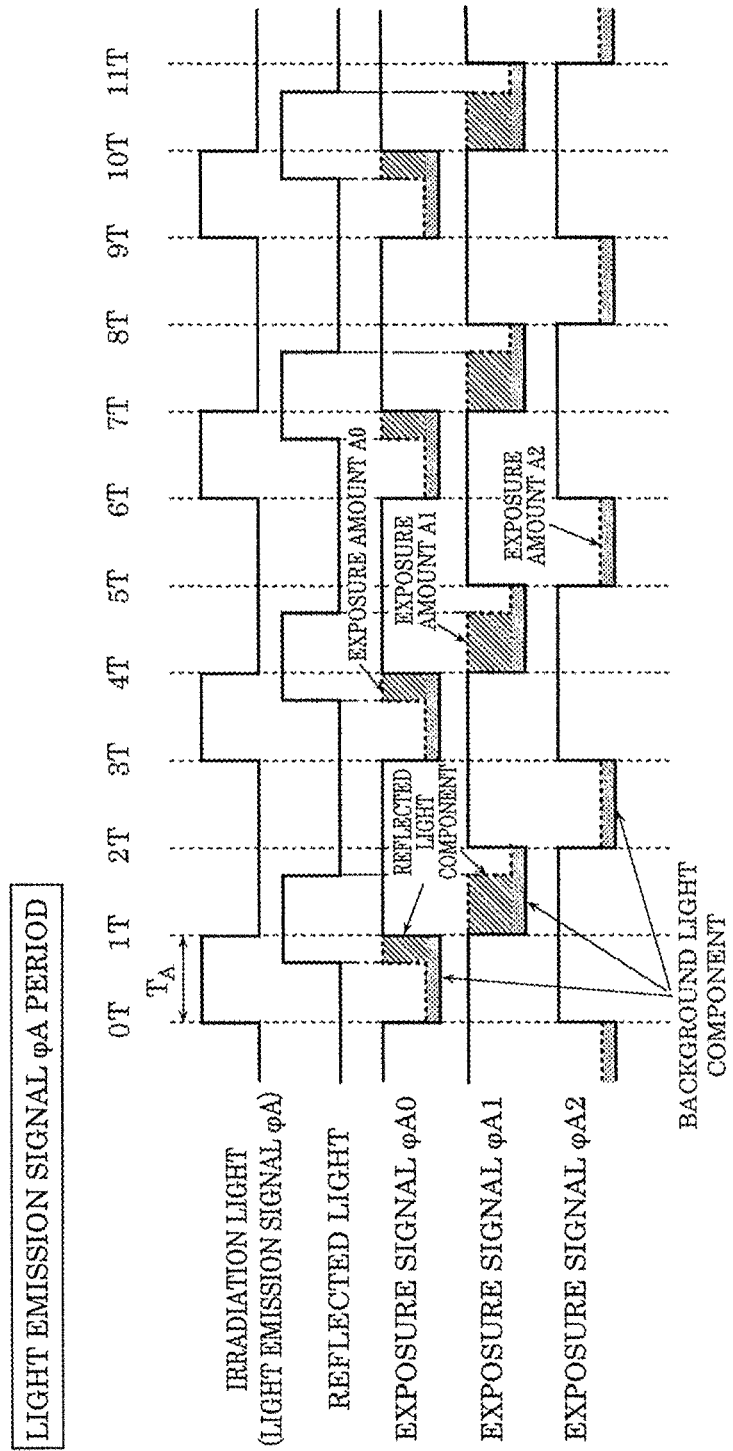

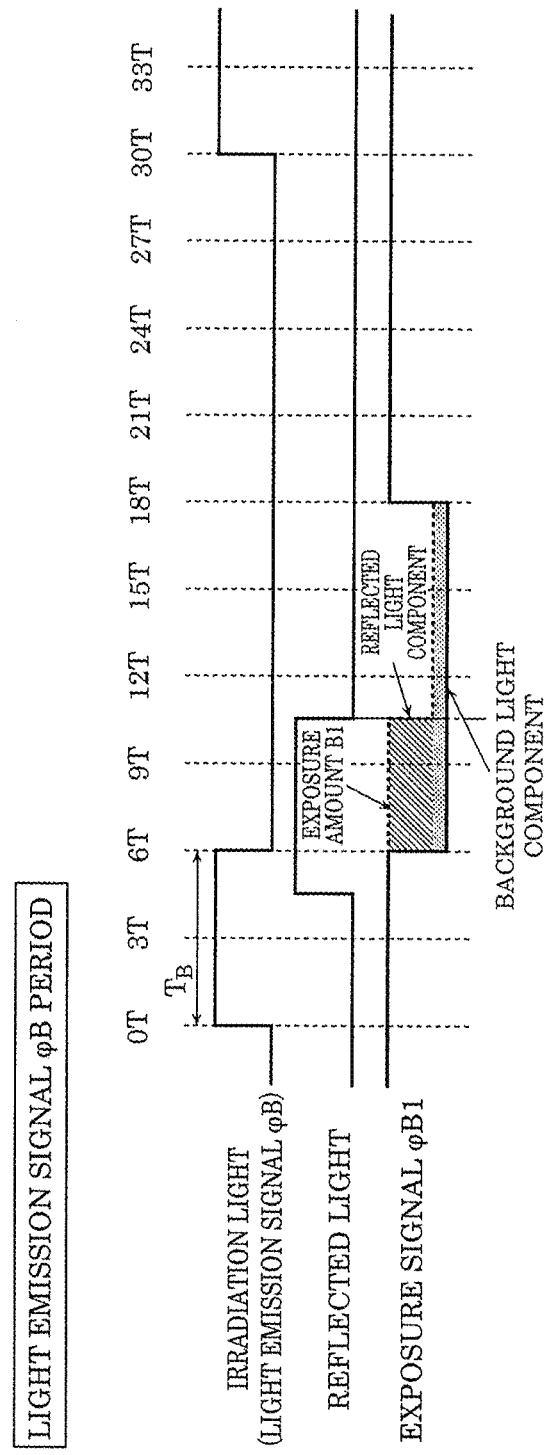

DISTANCE-MEASURING IMAGING DEVICE AND SOLID-STATE IMAGING DEVICE

CROSS REFERENCE TO RELATED APPLICATIONS

This application is a U.S. continuation application of PCT International Patent Application Number PCT/JP2016/002485 filed on May 23, 2016, claiming the benefit of priority of Japanese Patent Application Number 2015-152764 filed on Jul. 31, 2015, the entire contents of which are hereby incorporated by reference.

BACKGROUND

1. Technical Field

The present disclosure relates to a distance-measuring imaging device and a solid-state imaging device used in the distance-measuring imaging device.

2. Description of the Related Art

Of a plurality of methods for detecting an object, a time of flight (TOF) method of measuring a distance using a time of flight during which light travels to and from a measurement object (object) is known.

In the TOF method, the distance measurement accuracy (distance measurement resolution) and the distance range depend on the frequency of irradiation light (the length of a light emission period). When the frequency of irradiation light is higher, more accurate distance measurement is possible, but the measurable distance range is narrower.

For example, the following technique is known as one type of TOF method: By applying light of a plurality of different frequencies, distance measurement in a wider distance range is performed as if light of a low frequency is applied, while maintaining distance measurement accuracy as if light of a high frequency is applied (for example, see Japanese Unexamined Patent Application Publication No. 2013-538342).

SUMMARY

In typical TOF distance-measuring calculation, at least two signals are obtained for reflected light from an object, and the time difference or the phase difference between light emission and light reception (the time required for light to travel to and from the object) is calculated from the obtained signal amounts, to perform distance-measuring calculation. However, the measured distance calculated by such distance-measuring calculation exhibits cyclic folding with respect to the actual distance.

The structure in Japanese Unexamined Patent Application Publication No. 2013-538342 is intended to maintain distance measurement accuracy and widen the distance measurement range, by applying light of a plurality of different frequencies and performing distance-measuring calculation to determine the folding position. However, since folding occurs at each frequency, with the structure in Japanese Unexamined Patent Application Publication No. 2013-538342, light of many different frequencies needs to be applied in order to accurately determine the folding position. This increases the number of signals necessary for distance-measuring calculation. The structure in Japanese Unexamined Patent Application Publication No. 2013-538342 thus has a problem in that the time required for reading these signals increases and the frame rate decreases.

In view of the problem stated above, the present disclosure has an object of providing a distance-measuring imaging device and a solid-state imaging device that can maintain distance measurement accuracy and widen the distance measurement range with a reduced number of signals necessary for distance-measuring calculation.

To solve the stated problem, a distance-measuring imaging device according to an aspect of the present disclosure is a distance-measuring imaging device that measures a distance to an object by applying light to and receiving reflected light from the object, the distance-measuring imaging device including: a controller that outputs a light emission signal and an exposure signal; a light source that applies the light at timing indicated by the light emission signal; a solid-state imaging device that performs exposure to the reflected light at timing indicated by the exposure signal, and outputs an imaging signal indicating an exposure amount; and a calculator that calculates the distance to the object using the imaging signal, wherein the controller: cyclically outputs a first exposure signal group that is made up of a plurality of exposure signals different from each other in delay time with respect to the light emission signal and in which, before an exposure period of one exposure signal ends, an exposure period of at least one other exposure signal starts; and outputs a second exposure signal group that is made up of one or more exposure signals different from each other in delay time with respect to the light emission signal and that has a dead zone period during which all of the one or more exposure signals are in a non-exposure period, and the calculator calculates a first distance value using a first imaging signal obtained according to the first exposure signal group, calculates a second distance value using a second imaging signal obtained according to the second exposure signal group, and calculates the distance based on the first distance value and the second distance value.

With a distance-measuring imaging device, etc. according to the present disclosure, it is possible to maintain distance measurement accuracy and widen the distance measurement range with a reduced number of signals necessary for distance-measuring calculation.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 9A is a timing chart illustrating an example of the operation of the distance-measuring imaging device according to Embodiment 2;

FIG. 9B is a timing chart illustrating an example of the operation of the distance-measuring imaging device according to Embodiment 2;

DETAILED DESCRIPTION OF THE EMBODIMENTS

The following describes a distance-measuring imaging device according to embodiments of the present disclosure with reference to drawings. The embodiments described below each show a specific example of the present disclosure. The numerical values, shapes, materials, structural elements, the arrangement and connection of the structural elements, etc. shown in the following embodiments are mere examples, and do not limit the scope of the present disclosure.

(Embodiment 1)

Figure 1:
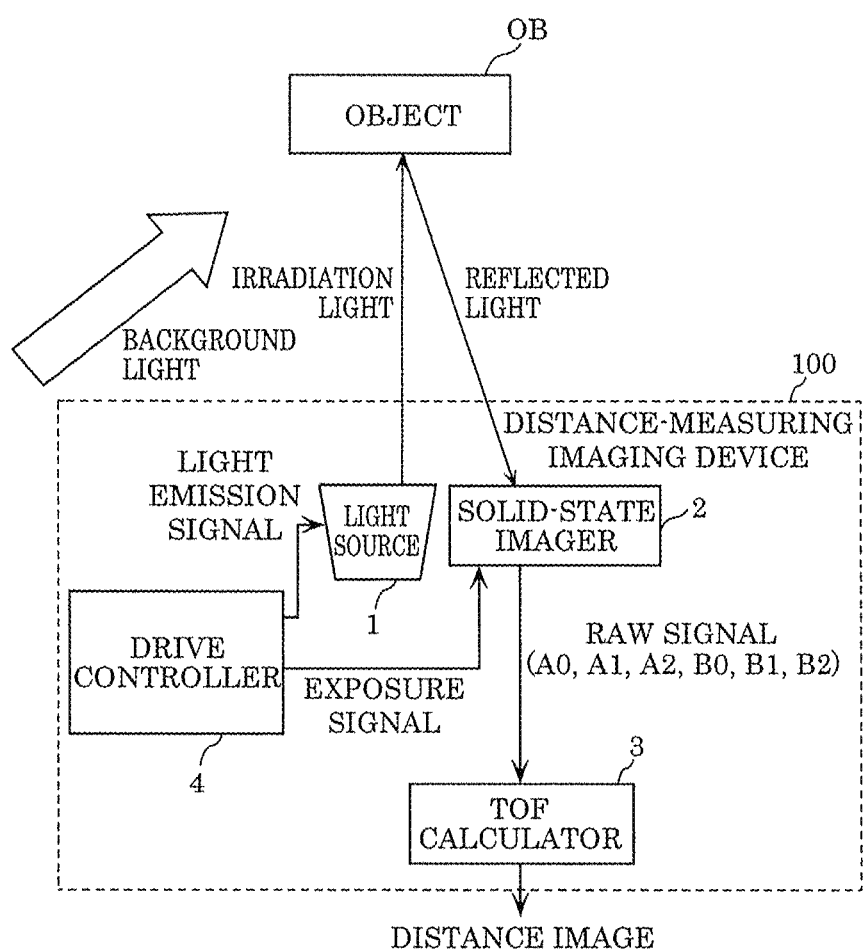
FIG. 1 is a functional block diagram illustrating an example of the schematic structure of a distance-measuring imaging device according to Embodiment 1.

FIG. 1 is a functional block diagram illustrating an example of the schematic structure of distance-measuring imaging device 100 according to Embodiment 1. Distance-measuring imaging device 100 illustrated in the drawing applies light (irradiation light) to and receives reflected light from object OB, to measure the distance to object OB. As illustrated in the drawing, distance-measuring imaging device 100 includes light source 1, solid-state imager (solid-state imaging device) 2, drive controller 4, and TOF calculator 3. The drawing also illustrates object OB. Distance-measuring imaging device 100 measures the distance from distance-measuring imaging device 100 to object OB.

Light source 1 is a light source that applies light at timing indicated by a light emission signal. In this embodiment, light source 1 irradiates object OB with light according to the timing of receiving a light emission signal generated by drive controller 4. For example, light source 1 includes a drive circuit, a capacitor, and a light-emitting element, and emits light by supplying a charge held in the capacitor to the light-emitting diode. The light-emitting element may be a laser diode, a light-emitting diode (LED), or the like.

Drive controller 4 is a controller that outputs a light emission signal and an exposure signal. In detail, drive controller 4 generates a light emission signal for instructing light application to a measurement object (object OB), and an exposure signal for instructing exposure to reflected light from object OB. For example, drive controller 4 is composed of a processing unit such as a microcomputer. The microcomputer includes a processor (microprocessor), memory, and the like. The processor executes a drive program stored in the memory, thus outputting the light emission signal and the exposure signal. Drive controller 4 may use FPGA (field-programmable gate array), ISP (in-system programming), or the like, and may be single hardware or multiple hardware. The light emission signal and the exposure signal output from drive controller 4 will be described in detail later.

Solid-state imager 2 is a solid-state imaging device that is exposed to reflected light at the timing indicated by the exposure signal, to output a raw signal (imaging signal) indicating the exposure amount. The raw signal is also referred to as raw data, and the imaging signal is also referred to as imaging information. These terms are hereafter used without distinction. In this embodiment, solid-state imager 2 performs, for an area including object OB, exposure to light a plurality of times according to the timing indicated by the exposure signal generated by drive controller 4, and obtains raw data (imaging information) corresponding to the total exposure amount of the exposure performed the plurality of times. Solid-state imager 2 includes, for example, a camera lens, a solid-state imaging element, and a circuit such as an A/D converter for generating and outputting raw data. The solid-state imaging element included in solid-state imager 2 will be described in detail later.

TOF calculator 3 is a calculator that calculates the distance to object OB using the raw data. In detail, TOF calculator 3 calculates and outputs a TOF signal (distance signal), i.e. information of the distance to object OB, based on a signal that is based on the raw data received from solid-state imager 2. For example, TOF calculator 3 is composed of a processing unit such as a microcomputer, as with drive controller 4. TOF calculator 3 calculates the TOF signal, by a processor executing a calculation program stored in memory. TOF calculator 3 may use FPGA, ISP, or the like, and may be single hardware or multiple hardware, as with drive controller 4. The distance calculation process by TOF calculator 3 will be described in detail later.

An example of the solid-state imaging element in solid-state imager 2 is described below.

Figure 2:
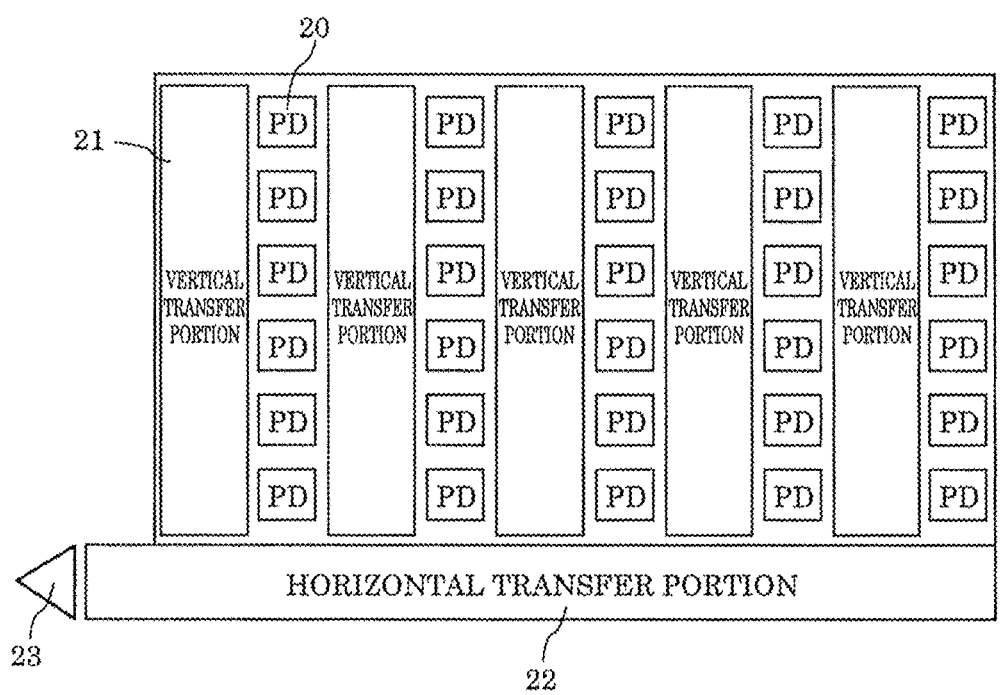
FIG. 2 is a schematic diagram illustrating an example of the functions of a CCD solid-state imaging element.

FIG. 2 is a schematic diagram illustrating the functions of a charge coupled device (CCD) solid-state imaging element that can be used in solid-state imager 2 in FIG. 1. As illustrated in the drawing, the CCD solid-state imaging element includes photodiode (PD) 20, vertical transfer portion 21, horizontal transfer portion 22, and signal charge detector 23. Photodiode 20 converts received light into a charge. Vertical transfer portion 21 includes a plurality of gates, and transfers charges read from photodiodes 20 sequentially in the vertical direction. Horizontal transfer portion 22 transfers charges received from vertical transfer portions 21 sequentially in the horizontal direction. Signal charge detector 23 sequentially detects the charges received from horizontal transfer portion 22, converts each charge into a voltage signal, and outputs the voltage signal.

In this solid-state imaging element, in a state where a readout gate from photodiode 20 to vertical transfer portion 21 is open, a substrate voltage is controlled according to an exposure signal, and photodiode 20 is exposed to light in a period during which the exposure signal is Low. A charge generated by this exposure is accumulated in vertical transfer portion 21.

Thus, by using a CCD image sensor (CCD solid-state imaging element) as solid-state imager 2 in FIG. 1, a global reset, i.e. an operation of resetting the plurality of photodiodes 20 at once, is possible. More accurate distance measurement can be achieved in this way.

A method of driving distance-measuring imaging device 100 in this embodiment is described below. The driving method described below is performed by, for example, drive controller 4.

Figure 3:
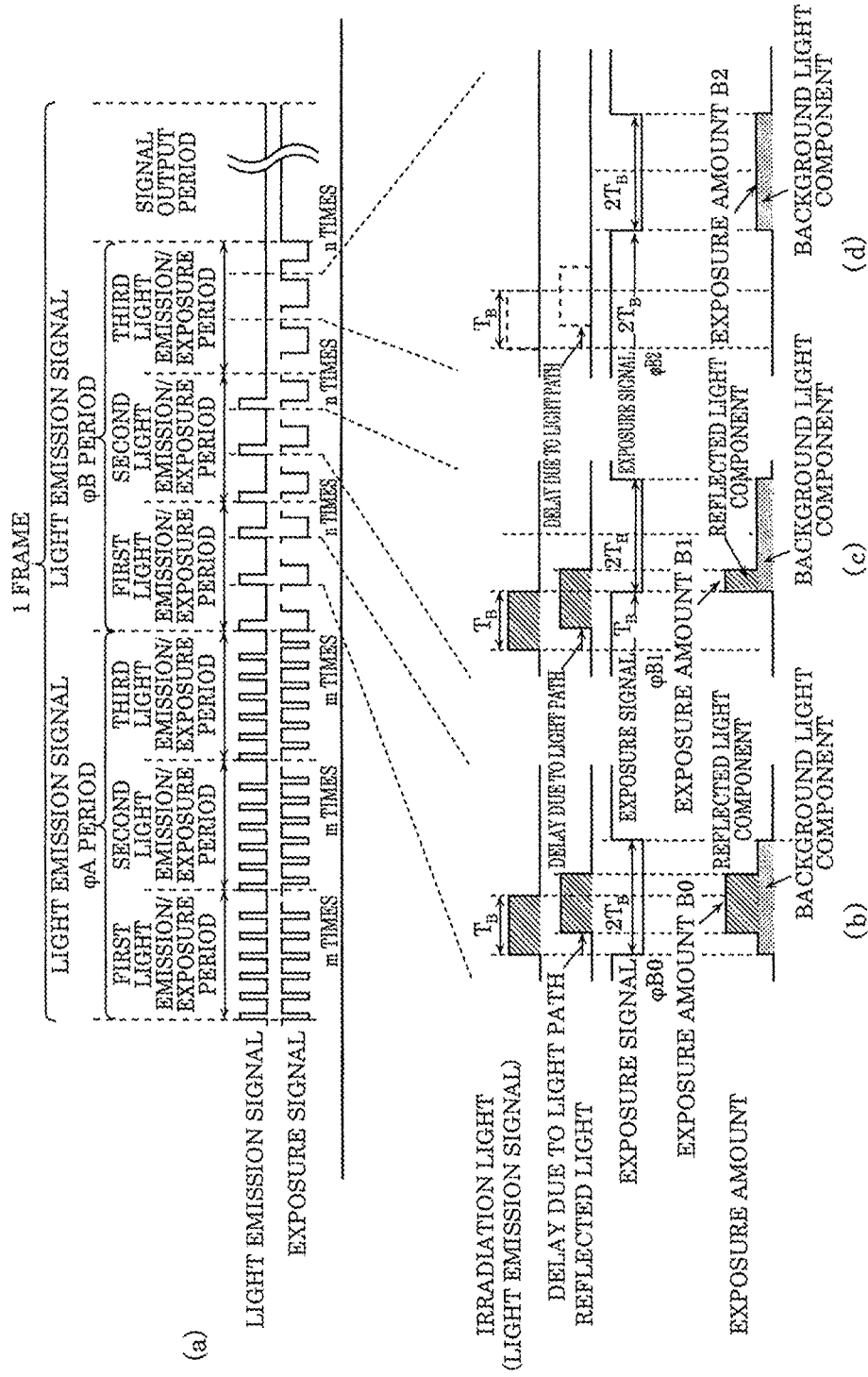
FIG. 3 is a diagram illustrating an example of exposure amount detection timing in the distance-measuring imaging device according to Embodiment 1.

FIG. 3 is a diagram illustrating an example of exposure amount detection timing in distance-measuring imaging device 100. (a) in FIG. 3 illustrates an example of the timing in one frame. (b) in FIG. 3 illustrates the exposure timing of exposure amount B0 in a first light emission/exposure period in a light emission signal φB period. (c) in FIG. 3 illustrates the exposure timing of exposure amount B1 in a second light emission/exposure period in the light emission signal φB period. (d) in FIG. 3 illustrates the exposure timing of exposure amount B2 in a third light emission/exposure period in the light emission signal φB period.

In this embodiment, one frame period includes: a light emission signal TA period during which light emission signal φA with a relatively short light emission period (High period in this example) is output as a light emission signal; the light emission signal φB period during which light emission signal φB with a relatively long light emission period is output as a light emission signal; and a signal output period, as illustrated in (a) in FIG. 3.

The light emission signal and the exposure signal in the light emission signal φA period and the light emission signal and the exposure signal in the light emission signal φB period are approximately the same, except the length of the light emission period and the below-mentioned dead zone period. Accordingly, the light emission signal φB period is mainly described below, while omitting the description of the light emission signal φA period.

As illustrated in (a) and (b) in FIG. 3, in the first light emission/exposure period in the light emission signal φB period, photodiode 20 is exposed to light in a period during which exposure signal φB0 (first exposure signal) is Low, and a charge generated by the exposure is accumulated in vertical transfer portion 21. This operation is repeatedly performed n times in this embodiment. When the first light emission/exposure period ends, the gates of vertical transfer portion 21 are controlled to transfer the charge to a packet with no readout gate.

The first light emission/exposure period is a period during which solid-state imager 2 receives the exposure signal and performs exposure after a first delay time with respect to the timing at which light source 1 receives the light emission signal and emits light. In this embodiment, the length of the period during which exposure signal φB0 is Low is set to $2 \times T_B$ which is twice the length of the light emission signal period (the period during which the light emission signal is High, i.e. light emission period $T_B$), and the delay time of exposure signal φB0 with respect to the light emission signal is set to 0. Thus, the first exposure signal period is set to a period during which the light emission signal is transmitted (High level).

Next, as illustrated in (a) and (c) in FIG. 3, in the second light emission/exposure period in the light emission signal φB period, photodiode 20 is exposed to light in a period during which exposure signal φB1 (second exposure signal) is Low, and a charge generated by the exposure is accumulated in vertical transfer portion 21. This operation is repeatedly performed n times in this embodiment. When the second light emission/exposure period ends, the gates of vertical transfer portion 21 are controlled to transfer the charge to a packet with no readout gate.

The second light emission/exposure period is a period during which solid-state imager 2 receives the exposure signal and performs exposure after a second delay time different from the first delay time with respect to the timing at which light source 1 receives the light emission signal and emits light. In this embodiment, the length of the second exposure signal period is set to $2 \times T_B$ which is twice the length of the light emission signal period and the same as the length of the first exposure signal period, and the delay time of exposure signal φB1 with respect to the light emission signal is set to $T_B$ which is the sum of first delay time 0 and the light emission signal period.

Next, as illustrated in (a) and (d) in FIG. 3, in the third light emission/exposure period in the light emission signal φB period, photodiode 20 is exposed to light in a period during which exposure signal φB2 (third exposure signal) is Low, and a charge generated by the exposure is accumulated in vertical transfer portion 21. This operation is repeatedly performed n times in this embodiment. When the third light emission/exposure period ends, the gates of vertical transfer portion 21 are controlled to perform transfer so that the charge by the exposure according to exposure signal φB0 is situated in a packet with a readout gate.

The third light emission/exposure period is a period during which solid-state imager 2 receives the exposure signal and performs exposure after a third delay time different from the first and second delay times with respect to the timing at which light source 1 receives the light emission signal and emits light. In this embodiment, the length of the third exposure signal period is set to $2 \times T_B$ which is twice the length of the light emission signal period and the same as the length of each of the first and second exposure signal periods, and the delay time of exposure signal φB2 with respect to the light emission signal is set to $2 \times T_B$ which is the sum of first delay time 0 and $2 \times T_B$, i.e. twice the light emission signal period. In this embodiment, no light emission operation is performed in the third light emission/exposure period in the light emission signal φB period. In other words, solid-state imager 2 performs exposure after the third delay time with respect to the corresponding timing on the assumption that light source 1 receives the light emission signal and emits light.

This series of operations (the operations in the light emission signal φA period and the light emission signal φB period) is repeatedly performed N times in this embodiment. After this, the transfer of vertical transfer portion 21 and the transfer of horizontal transfer portion 22 are repeatedly performed sequentially, and the charge is converted into a voltage signal in signal charge detector 23 and output.

In this way, a plurality of packets already provided in vertical transfer portion 21 can be used as accumulators of signals obtained in a plurality of exposure periods that differ in the timing of the exposure signal for receiving reflected light from object OB with respect to the light emission signal. This makes it unnecessary to newly form signal accumulators. Photodiode 20 can be made larger with the same area, with it being possible to increase saturation sensitivity and increase the maximum light reception amount. Highly accurate distance measurement can thus be achieved.

A distance-measuring imaging mechanism of distance-measuring imaging device 100 in this embodiment is described below, with reference to FIGS. 4A to 5.

Figure 4A:
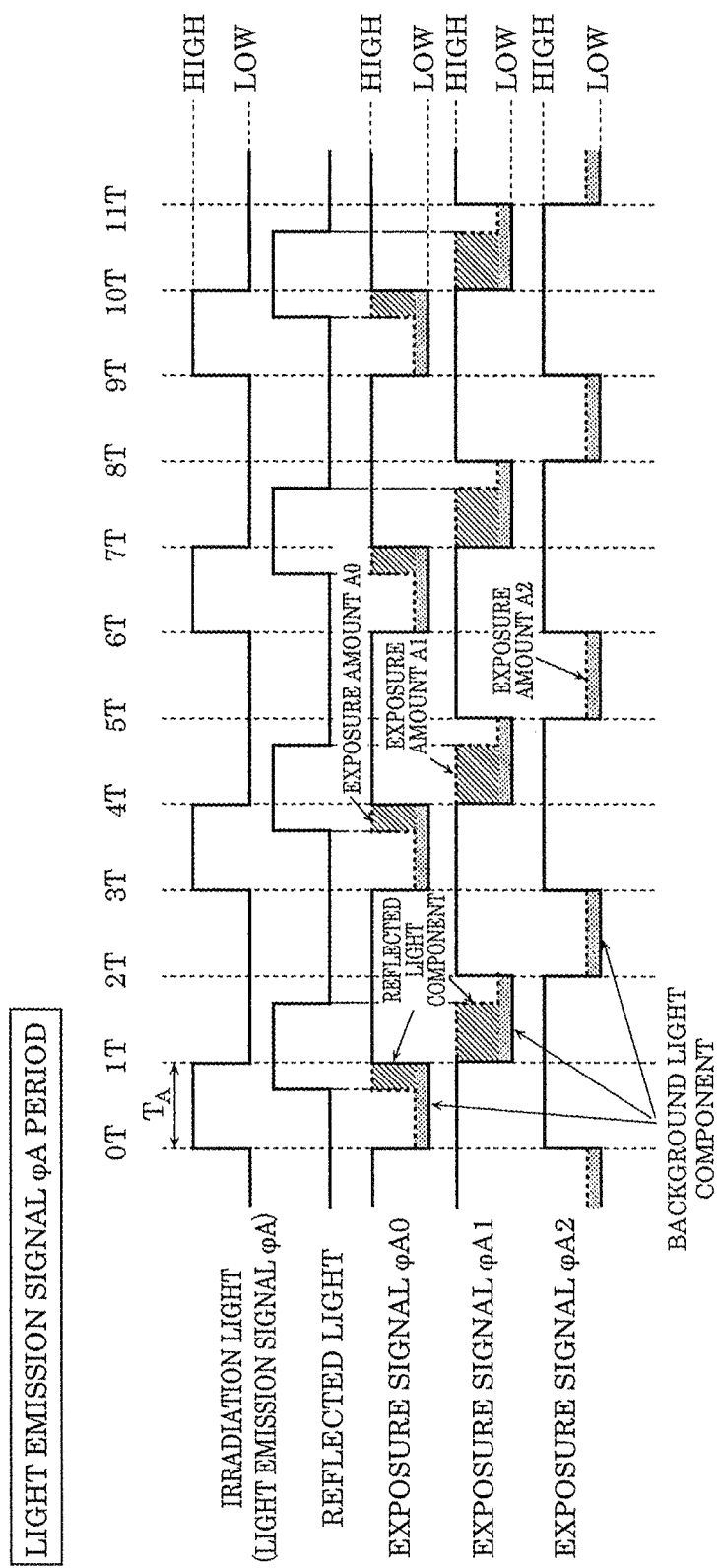
FIG. 4A is a timing chart illustrating an example of the operation of the distance-measuring imaging device according to Embodiment 1.
Figure 4B:
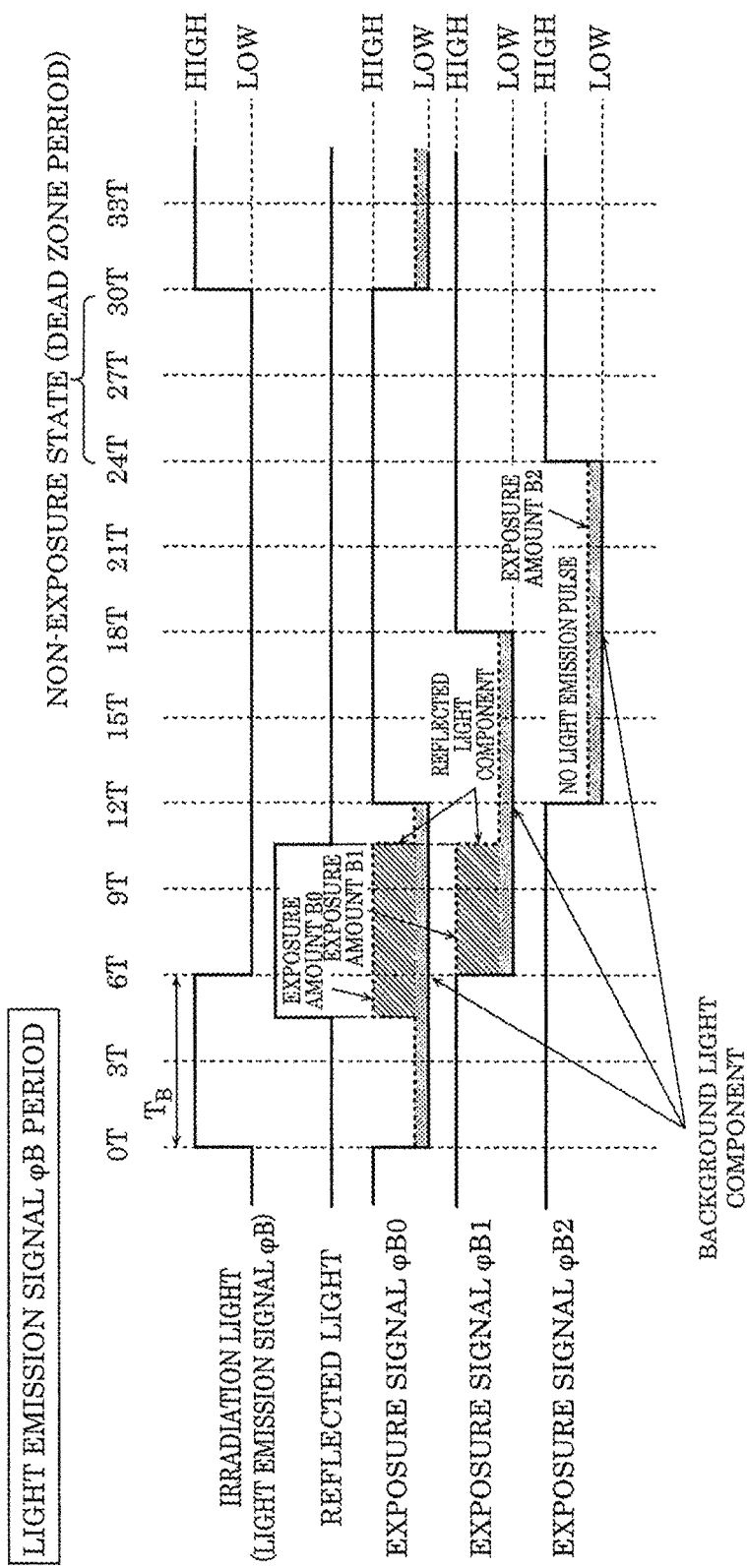
FIG. 4B is a timing chart illustrating an example of the operation of the distance-measuring imaging device according to Embodiment 1.

FIGS. 4A and 4B are each a timing chart illustrating the operation of distance-measuring imaging device 100 in this embodiment, and illustrate the comparative relationships of exposure signals φA0 to φA2 and φB0 to φB2. In detail, FIG. 4A illustrates the timings of irradiation light (light emission signal φA), reflected light, and exposure signals φA0 to φA2 in the light emission signal φA period. FIG. 4B illustrates the timings of irradiation light (light emission signal φB), reflected light, and exposure signals φB0 to φB2 in the light emission signal φB period.

In these drawings, the exposure amounts obtained according to corresponding exposure signals φA0 to φA2 and φB0 to φB2 are indicated by hatching. "1T" in these drawings is a clock unit. In the case where the drive frequency of the system (distance-measuring imaging device 100) is 50 MHz, 1T period is 20 nsec.

First, drive controller 4 outputs the light emission signal and the exposure signal, and light source 1 applies light when the light emission signal is High. Solid-state imager 2 performs exposure to reflected light of the light from object OB, in a period during which the exposure signal is Low. In this way, the total exposure amount in the Low period is photoelectrically converted. TOF calculator 3 calculates the distance based on raw data (imaging signal) of the voltage output of solid-state imager 2, and outputs the calculated distance as a distance image.

As illustrated in FIGS. 4A and 4B, the relationship between the light emission signal and the exposure signal is as follows: exposure signals φA0 to φA2 correspond to light emission signal φA, and exposure signals φB0 to φB2 correspond to light emission signal φB. Thus, exposure signals of three patterns correspond to each light emission signal. In detail, light emission signal φA is a first light emission signal that is a reference signal for the delays of exposure signals φA0 to φA2, and light emission signal φB is a second light emission signal that is a reference signal for the delays of exposure signals φB0 to φB2.

Exposure signals φA0 to φA2 constitute an exposure signal group (hereafter, "exposure signal group A") in which exposure signals φA0 to φA2 perform exposure with a time difference of the length of ⅓ of the light emission cycle of light emission signal φA from each other, and always at least one of exposure signals φA0 to φA2 is in an exposure period for reflected light. Exposure signal group A is thus a first exposure signal group that is made up of a plurality of exposure signals different in delay time from each other with respect to the light emission signal (light emission signal φA in this embodiment) and in which, before the exposure period of one exposure signal ends, the exposure period of at least one other exposure signal starts. Such exposure signal group A is cyclically output by drive controller 4.

Exposure signals φB0 to φB2 constitute an exposure signal group (hereafter, "exposure signal group B") in which exposure signals φB0 to φB2 perform exposure with a time difference of the length of ⅕ of the light emission cycle of light emission signal φB from each other, and that has a dead zone period during which all exposure signals φB0 to φB2 are in a non-exposure period (non-exposure state). Exposure signal group B is thus a second exposure signal group that is made up of one or more exposure signals (a plurality of exposure signals in this embodiment) different in delay time with respect to the light emission signal (light emission signal φB in this embodiment) and has a dead zone period during which all of the one or more exposure signals are in a non-exposure period.

In detail, in this embodiment, i exposure signals (i is an integer of 2 or more) (three exposure signals φB0 to φB2 in this embodiment) constituting exposure signal group B are a group of exposure signals that differ in delay time by 1/j of the light emission cycle of light emission signal φB (where j>i, j=5 in this embodiment). Therefore, exposure signal group B has a dead zone period during which all of the plurality of exposure signals are in a non-exposure period.

By exposure control according to exposure signal φB0, exposure to the whole reflected light is performed, with it being possible to detect an exposure amount including information of the reflectivity of object OB. By exposure control according to exposure signal φB1, exposure is started simultaneously with the trailing of light emission signal φB, with it being possible to detect an exposure amount including information of the distance to object OB. By exposure control according to exposure signal φB2, no light emission operation is performed, with it being possible to detect background light such as sunlight and offset components including dark current components.

Moreover, the pulse width of light emission signal φB has a light emission period six times the pulse width of light emission signal φA. Of light emission signals φA and φB, measurement according to light emission signal φA has higher distance measurement accuracy, and measurement according to light emission signal φB has a wider distance measurement range.

Let A0, A1, and A2 be the exposure amounts by exposure signal group A, B0, B1, and B2 be the exposure amounts by exposure signal group B, $T_A$ be the pulse width of light emission signal φA applied, $T_B$ be the pulse width of light emission signal φB applied, c be the speed of light (299792458 m/s), Za be the distance measurement value (first distance value) based on exposure signal group A, and Zb be the distance measurement value (second distance value) based on exposure signal group B. Then, distance value Za can be calculated according to the following Expression 1 using exposure signal group A.

In Expression 1, the following definitions are applied:

(i) In the case where the minimum signal is A2 (the time difference between irradiation light and reflected light is within 1T), signal 1 is A0, signal 2 is A1, and signal 3 is A2.

(ii) In the case where the minimum signal is A0 (the time difference between irradiation light and reflected light is within 2T), signal 1 is A1, signal 2 is A2, and signal 3 is A0.

(iii) In the case where the minimum signal is A1 (the time difference between irradiation light and reflected light is within 3T), signal 1 is A2, signal 2 is A0, and signal 3 is A1.

[Math. 1]

$$Za = \frac{c \cdot T_A}{2} \left( \frac{\text{signal2} - \text{signal3}}{\text{signal1} + \text{signal2} - 2 \times \text{signal3}} \right). \quad \text{(Expression 1)}$$

Figure 5:
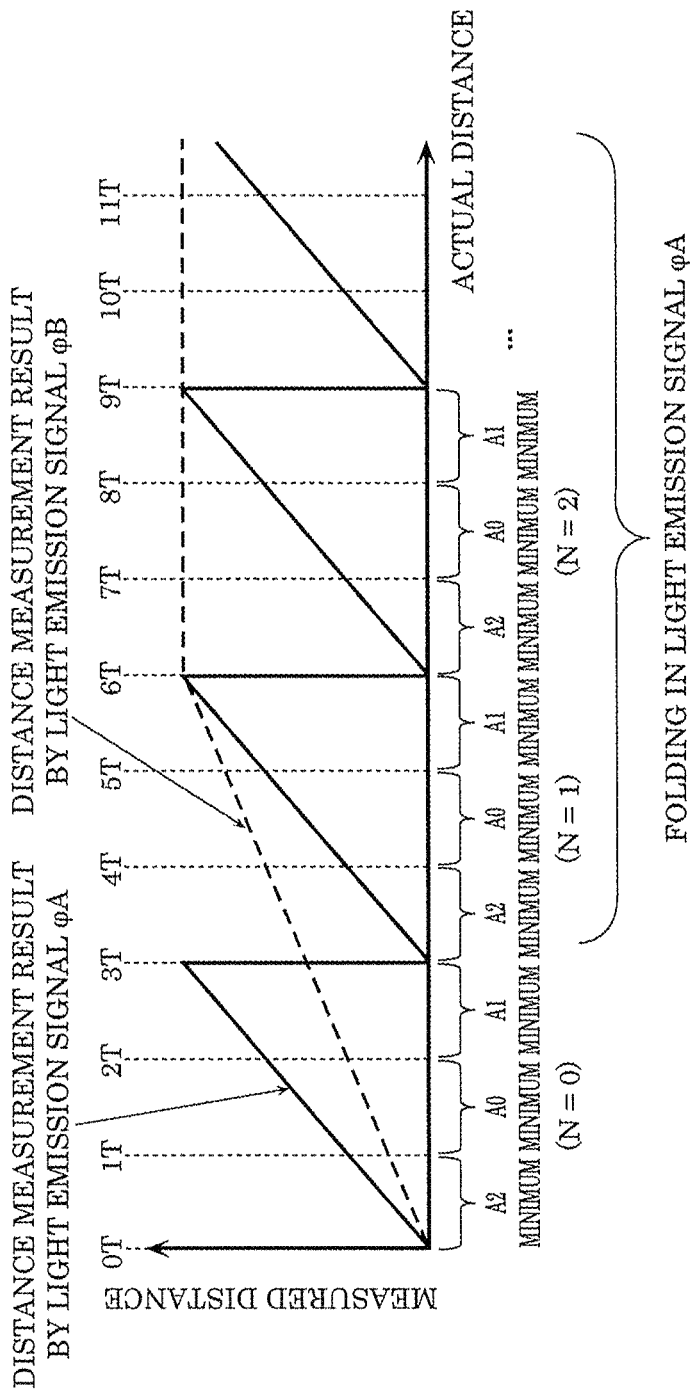
FIG. 5 is a graph illustrating the relationship between the measured distance and the actual distance to an object in Embodiment 1.

Here, since exposure signal group A is continuously (cyclically) repeated, in the case where the time difference between irradiation light (light emission signal) and reflected light is 3T or more, folding appears as illustrated in FIG. 5.

FIG. 5 is a graph illustrating the relationship between the measured distance as the calculation result of TOF calculator 3 in the timings illustrated in FIGS. 4A and 4B and the actual distance to object OB.

As illustrated in the drawing, uncertainty of N=0, 1, 2, . . . actually remains as indicated by Expression 2.

[Math. 2]

$$Za = \frac{c \cdot T_A}{2} \left( \frac{\text{signal2} - \text{signal3}}{\text{signal1} + \text{signal2} - 2 \times \text{signal3}} + 3N \right). \quad \text{(Expression 2)}$$

Meanwhile, distance value Zb can be calculated according to the following Expression 3.

[Math. 3]

$$Zb = \frac{c \cdot T_B}{2} \left( \frac{B1 - B2}{B0 - B2} \right). \quad \text{(Expression 3)}$$

Thus, TOF calculator 3 calculates the first distance value (Za in this embodiment), using a first imaging signal (respective raw data indicating A0, A1, and A2 in this embodiment) obtained by exposure signal group A. TOF calculator 3 also calculates the second distance value (Zb in this embodiment), using a second imaging signal (respective raw data indicating B0, B1, and B2 in this embodiment) obtained by exposure signal group B. TOF calculator 3 then calculates the distance to object OB based on the first distance value and the second distance value, in the following manner. In this embodiment, TOF calculator 3 calculates the second distance value using only the second imaging signal from among the first imaging signal and the second imaging signal.

Since light emission signal φB has a longer light emission period than light emission signal φA, the distance measurement accuracy by light emission signal φB is lower than the distance measurement accuracy by light emission signal φA. However, exposure signal group B has a period during which no exposure to reflected light is performed, so that no folding occurs in the measured distance as illustrated in FIG. 5. In other words, in the distance measurement by exposure signal group B, the measured distance and the actual distance to object OB link to each other on a one-to-one basis.

Accordingly, by obtaining the difference between Zb and Za for each N and finding such N that corresponds to the minimum absolute value of the difference, uncertainty of measured distance value Za by light emission signal φA having excellent distance measurement accuracy can be resolved to thus calculate the actual distance to object OB with high accuracy.

As described above, according to this embodiment, combining exposure signal group A and exposure signal group B enables specifying the folding position in light emission signal φA (dealiasing). In detail, TOF calculator 3 calculates the distance to object OB, using the number of times folding occurs in Za (the distance measurement value based on exposure signal group A, i.e. the first distance value) that is specified using Zb (the distance measurement value based on exposure signal group B, i.e. the second distance value). Consequently, a wide distance measurement range based on light emission signal φB with a longer light emission period can be achieved while maintaining distance measurement accuracy based on light emission signal φA with a shorter light emission period.

In other words, according to this embodiment, drive controller 4 performs driving in each of a continuous wave (CW) method and a pulse method. The CW method is a driving method of outputting a plurality of exposure signals (exposure signals φA0 to φA2 in this embodiment) whose respective exposure periods have a continuous connection.

The pulse method is a driving method of outputting a plurality of exposure signals (exposure signals φB0 to φB2 in this embodiment) whose respective exposure periods do not have a continuous connection. According to this embodiment, TOF calculator 3 dealiases distance information obtained by the CW method, using distance information obtained by the pulse method. In this way, uncertainty (uncertainty due to folding) of distance information by the CW method is resolved while maintaining distance measurement accuracy by the CW method, so that a wider distance measurement range can be achieved.

Although the light emission period of light emission signal φB is controlled to be six times the light emission period of light emission signal φA in this embodiment, the ratio between the light emission period of light emission signal φA and the light emission period of light emission signal φB may be controlled depending on the distance measurement range. In detail, when the light emission period of light emission signal φA is shorter, distance measurement accuracy is higher. When the light emission period of light emission signal φB is longer, the distance measurement range is wider. The ratio may therefore be set appropriately depending on the specifications concerning the distance measurement required of distance-measuring imaging device 100.

Although each exposure signal group (exposure signal group A and exposure signal group B) is made up of three exposure signals in this embodiment, the number of exposure signals is not limited to such. Distance-measuring imaging device 100 can perform distance-measuring calculation by using the exposure signal group made up of two or more exposure signals.

TOF calculator 3 may perform a noise reduction filtering process on at least one of Za and Zb, and calculate the distance to object OB using the at least one of Za and Zb after the noise reduction filtering process. In detail, TOF calculator 3 in this embodiment may perform the noise reduction filtering process on each of Za and Zb, when obtaining the difference between Za and Zb to resolve uncertainty of Za.

Figure 6:
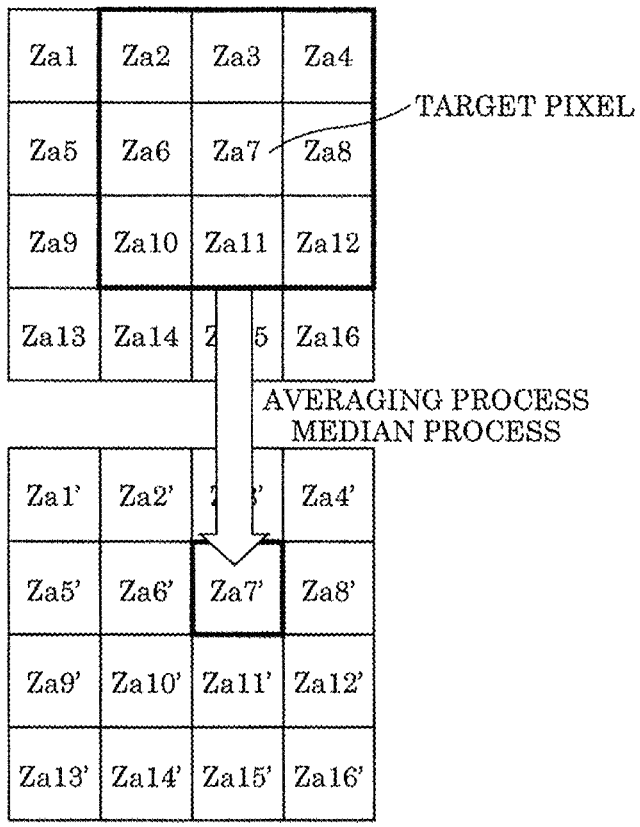
FIG. 6 is a diagram illustrating an example of a noise reduction filtering process for a distance value in Embodiment 1.

FIG. 6 is a diagram illustrating an example of such a noise reduction filtering process for a distance value. As illustrated in the drawing, TOF calculator 3 performs an averaging process or a median process on a 3×3 pixel region centering on a target pixel, and performs a noise reduction filtering process such as replacing distance value Za7 of the target pixel with calculated value Za7' by the averaging process or the median process. By performing such a noise reduction filtering process on each of Za and Zb and then obtaining the difference between Za and Zb after the process, TOF calculator 3 can resolve uncertainty of Za.

Thus, a determination error of the distance to object OB can be prevented by performing a noise reduction filtering process on at least one of Za and Zb. In detail, in this embodiment, a determination error of the number of times folding occurs in Za can be prevented by performing such a process, as a result of which a determination error of the distance to object OB can be prevented.

The noise reduction filtering process may be performed on only one of Za and Zb. However, by performing the noise reduction filtering process on both of Za and Zb, a determination error of the distance to object OB can be prevented more reliably.

TOF calculator 3 may perform γ correction on Za and Zb separately and obtain the difference between Za and Zb after the γ correction, to resolve uncertainty of Za.

Although FIG. 3 illustrates an example where distance-measuring imaging device 100 performs exposure according to exposure signal group A and exposure signal group B in one frame period, distance-measuring imaging device 100 may perform exposure according to exposure signal group A in the first frame, and perform exposure according to exposure signal group B in the second frame. Distance-measuring imaging device 100 may thus detect the exposure amount in a frame division manner.

As described above with reference to the drawings, according to this embodiment, by combining the control of repeatedly performing exposure so that exposure periods for reflected light have a continuous connection with the exposure control having a period during which exposure periods have no continuous connection, distance measurement of a wider distance range can be achieved as if operating at low frequency while maintaining distance measurement accuracy as if operating at high frequency, with a reduced number of signals necessary for TOF calculation. Distance-measuring imaging device 100 with a reduced time required for signal reading and an improved frame rate can thus be provided.

In detail, according to this embodiment, the first distance value (Za in this embodiment) is calculated using first exposure signal group A that is made up of a plurality of exposure signals φA0 to φA2 different from each other in delay time with respect to light emission signal φA and in which, before the exposure period of one exposure signal ends, the exposure period of at least one other exposure signal starts. Moreover, the second distance value (Zb in this embodiment) is calculated using second exposure signal group B that is made up of one or more exposure signals φB0 to φB2 different from each other in delay time with respect to light emission signal φB and that has a dead zone period during which all of the one or more exposure signals φB0 to φB2 are in a non-exposure period. The distance to object OB is then calculated based on the first distance value and the second distance value.

In this way, the number of times folding occurs in the first distance value can be specified. Accordingly, the distance to object OB can be calculated in the distance range of the second distance value, while maintaining the distance accuracy (distance resolution) of the first distance value. It is thus possible to maintain distance measurement accuracy and widen the distance measurement range. Moreover, the number of signals (imaging signals) necessary for distance-measuring calculation can be reduced, as compared with the case of specifying the folding position by continuously applying light of many different frequencies without providing a dead zone period. Distance-measuring imaging device 100 according to this embodiment can thus maintain distance measurement accuracy and widen the distance measurement range, with a reduced number of signals necessary for distance-measuring calculation.

(Variation of Embodiment 1)

The solid-state imager is not limited to a CCD image sensor. The same distance-measuring imaging device can be achieved even when any other solid-state imaging element (image sensor) such as a complementary metal-oxide semiconductor (CMOS) image sensor (CMOS solid-state imaging element) is used in view of other requirements of a distance-measuring imaging device.

Figure 7:
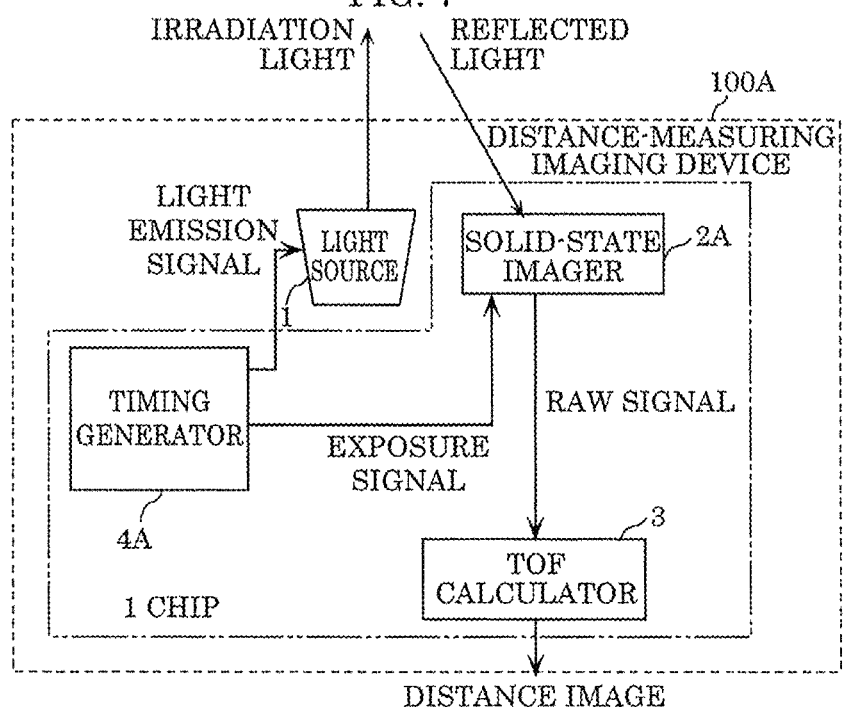
FIG. 7 is a functional block diagram illustrating an example of the schematic structure of a distance-measuring imaging device according to a variation of Embodiment 1.

FIG. 7 is a functional block diagram illustrating an example of the schematic structure of such distance-measuring imaging device 100A. Distance-measuring imaging device 100A illustrated in the drawing is similar to the distance-measuring imaging device in Embodiment 1, but includes solid-state imager 2A and timing generator 4A (controller) instead of solid-state imager 2 and drive controller 4.

Solid-state imager 2A includes a CMOS solid-state imaging element. In this variation, solid-state imager 2A is included in one chip together with timing generator 4A and TOF calculator 3 as illustrated in FIG. 7, for size reduction (miniaturization), power consumption reduction, and the like of distance-measuring imaging device 100A.

(Embodiment 2)

A distance-measuring imaging device according to Embodiment 2 is described below with reference to drawings. The following description mainly focuses on the differences from Embodiment 1.

Figure 8:
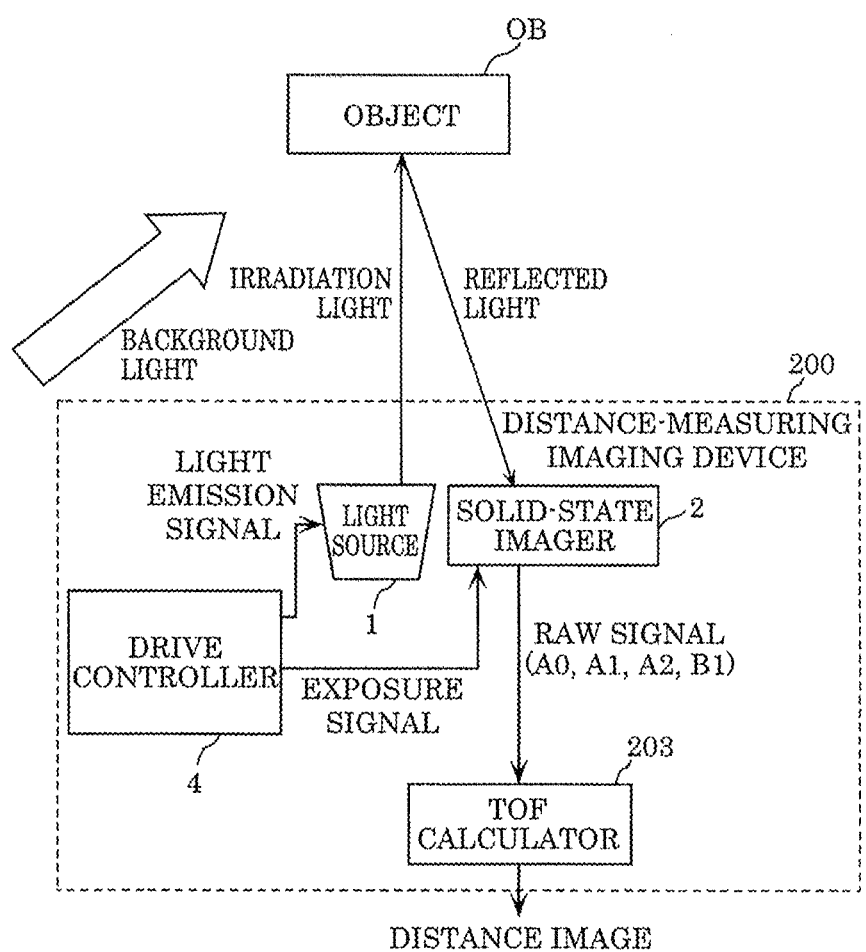
FIG. 8 is a functional block diagram illustrating an example of the schematic structure of a distance-measuring imaging device according to Embodiment 2.

FIG. 8 is a functional block diagram illustrating an example of the schematic structure of distance-measuring imaging device 200 according to Embodiment 2. The drawing also illustrates object OB. Distance-measuring imaging device 200 measures the distance from distance-measuring imaging device 200 to object OB.

The difference of distance-measuring imaging device 200 illustrated in the drawing from distance-measuring imaging device 100 illustrated in FIG. 1 is that TOF calculator 203 calculates exposure amount B0 detected by B0 exposure control and exposure amount B2 detected by B2 exposure control from the exposure amount obtained according to exposure signal group A.

The operation (driving method) of distance-measuring imaging device 200 in this embodiment is described below.

FIGS. 9A and 9B are each a timing chart illustrating the operation of distance-measuring imaging device 200 in this embodiment. In detail, FIG. 9A illustrates the timings of irradiation light (light emission signal φA), reflected light, and exposure signals φA0 to φA2 in the light emission signal φA period. FIG. 9B illustrates the timings of irradiation light (light emission signal φB), reflected light, and exposure signal φB1 in the light emission signal φB period. In these drawings, the exposure amounts obtained according to the corresponding exposure signals are indicated by hatching, as in FIGS. 4A and 4B.

The basic operation of distance-measuring imaging device 200 in this embodiment is briefly described first.

In the light emission signal φA period, the same operation as in Embodiment 1 is performed, as illustrated in FIG. 9A.

In the light emission signal φB period, only exposure control according to exposure signal φB1 in Embodiment 1 is performed, as illustrated in FIG. 9B.

In this embodiment, TOF calculator 203 calculates the second distance value (Zb in this embodiment) using the second imaging signal (raw data indicating B1 in this embodiment) having the smaller number of signals than the first imaging signal (respective raw data indicating A0, A1, and A2 in this embodiment). In detail, TOF calculator 203 estimates, using the first imaging signal, an imaging signal (respective raw data indicating B0 and B2 in this embodiment) obtained in the case where drive controller 4 outputs an exposure signal (exposure signals φB0 and φB2 in this embodiment) that has the same exposure period as each exposure signal (exposure signal φB1 in this embodiment) in the second exposure signal group and differs from each exposure signal in the second exposure signal group in delay time with respect to the light emission signal. TOF calculator 203 calculates the second distance value, using the estimated imaging signal and the second imaging signal.

A method by which TOF calculator 203 estimates exposure amounts B0 and B2 obtained in the case where drive controller 4 outputs exposure signals φB0 and φB2 is described in detail below.

Exposure amounts B0 and B2 can be calculated according to the following Expressions 4 to 6, using exposure amounts A0, A1, and A2.

(i) In the case where the minimum signal is A2:

$$B0=6\times(A0+A1), B2=12\times A2 \quad \text{(Expression 4)}$$

(ii) In the case where the minimum signal is A0:

$$B0=6\times(A1+A2), B2=12\times A0 \quad \text{(Expression 5)}$$

(iii) In the case where the minimum signal is A1:

$$B0=6\times(A0+A2), B2=12\times A1 \quad \text{(Expression 6)}.$$

Distance values Za and Zb can be calculated by the same calculation expressions as in Embodiment 1. The actual distance to the subject can be calculated by resolving uncertainty of Za.

As described above, in this embodiment, by combining exposure control according to exposure signal group A with exposure control according to exposure signal φB1, the number of signals necessary for distance-measuring calculation can be reduced from six imaging signals (raw data) indicating respective exposure amounts A0, A1, A2, B0, B1, and B2 to four imaging signals indicating respective exposure amounts A0, A1, A2, and B1, with the same distance measurement accuracy and distance measurement range as in Embodiment 1. Hence, the time required for reading can be reduced to improve the frame rate.

Figure 10:
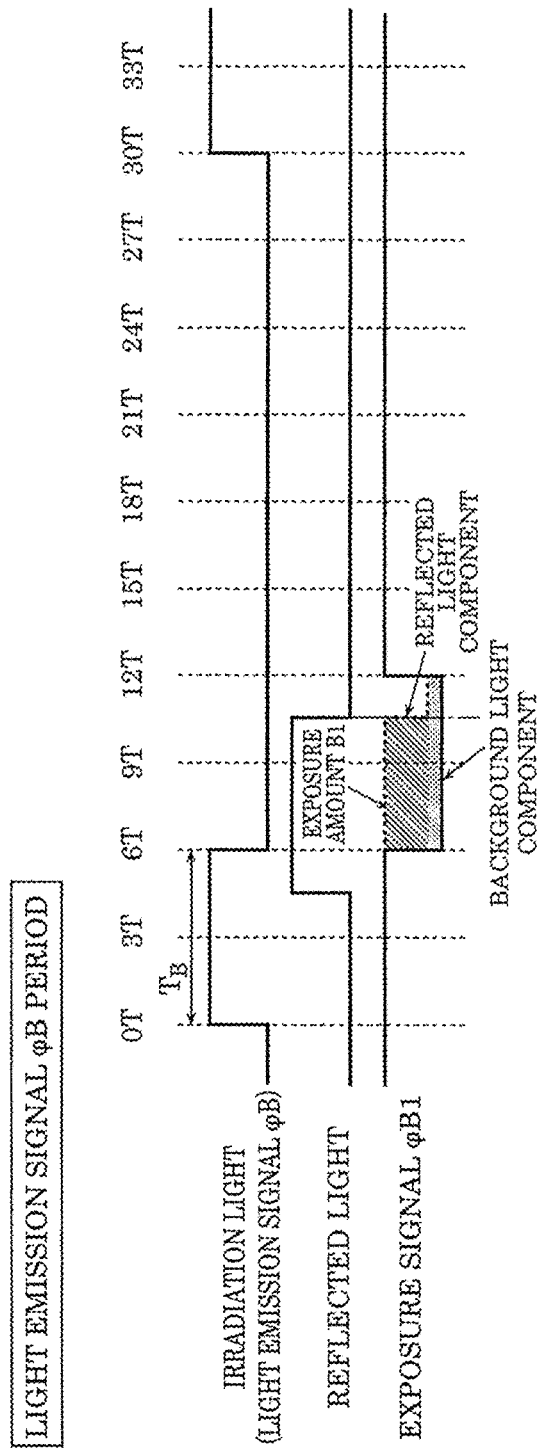
FIG. 10 is a timing chart illustrating another example of the operation of the distance-measuring imaging device according to Embodiment 2.

The exposure period of exposure signal φB1 is not limited to 12T as illustrated in FIG. 9B, and may be, for example, a half period, i.e. 6T. FIG. 10 is a timing chart illustrating such exposure signal φB1. The drawing illustrates the timings of irradiation light, reflected light, and exposure signal φB1 and the exposure amount, as in FIG. 9B. By halving the exposure period in the exposure control according to exposure signal φB1 as illustrated in FIG. 10, the influence of intruding background light can be halved while maintaining the same distance measurement range as in the case where the exposure period of exposure signal φB1 is long.

Figure 11:
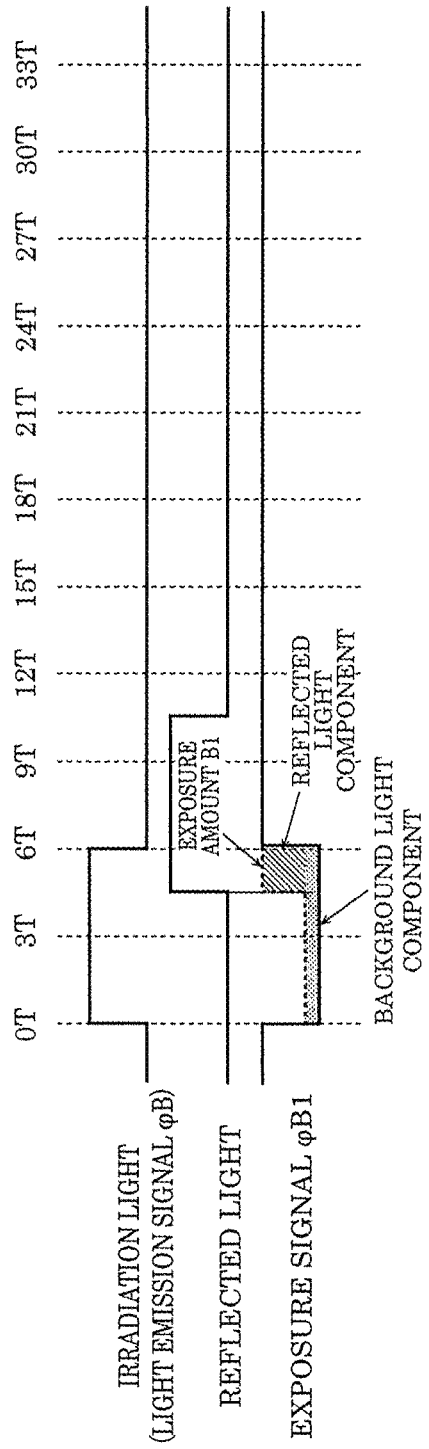
FIG. 11 is a timing chart illustrating another example of the operation of the distance-measuring imaging device according to Embodiment 2.

The exposure period of exposure signal φB1 may be synchronous with the light emission period of the light emission signal. FIG. 11 is a timing chart illustrating such exposure signal φB1, and illustrates the timings of each type of signal and the like and the exposure amount as in FIG. 10. Thus, the exposure control according to exposure signal φB1 may be performed by synchronizing the light emission period and the exposure period, as illustrated in FIG. 11.

Figure 12:
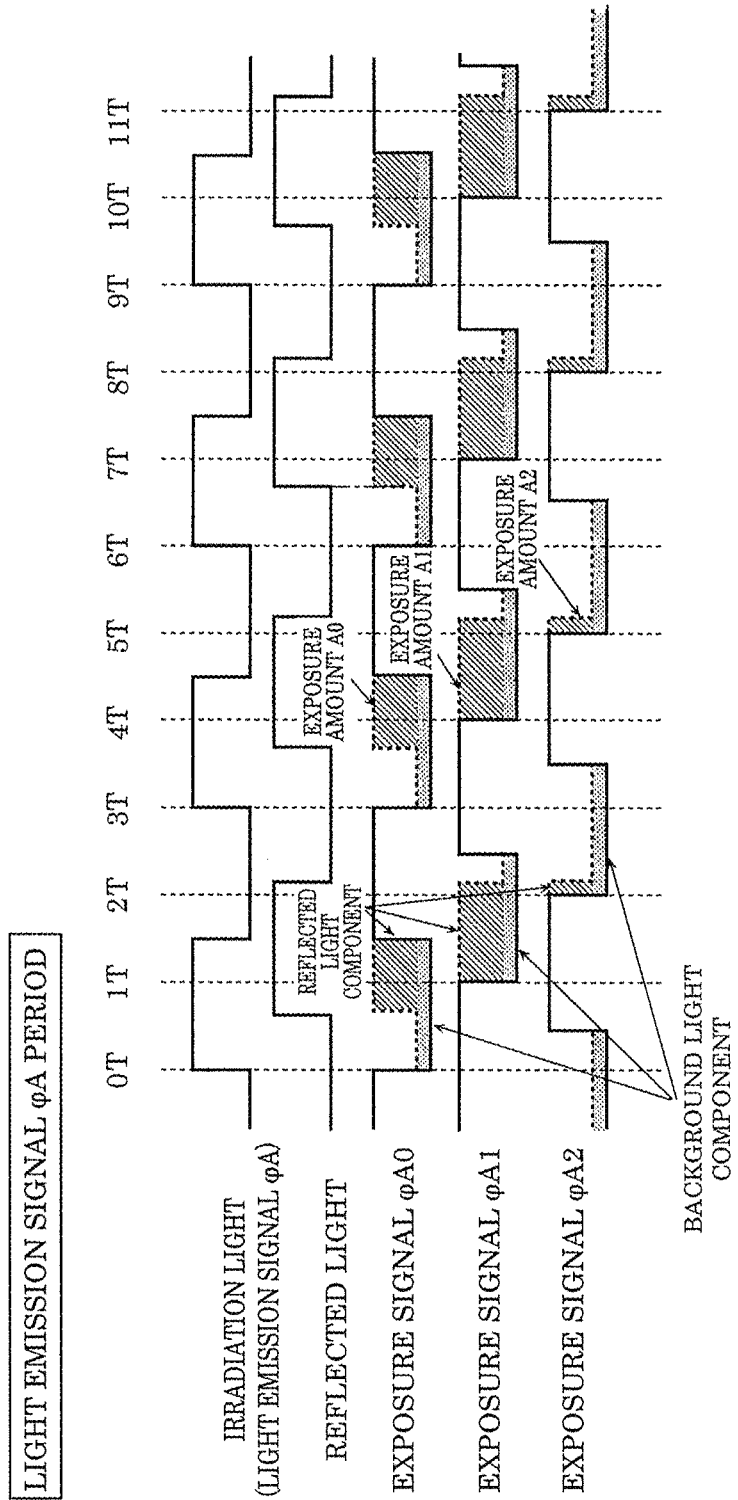
FIG. 12 is a timing chart illustrating another example of the operation of the distance-measuring imaging device according to Embodiment 2.

Exposure signals φA0 to φA2 may have their exposure periods overlapping each other, as long as there is no dead zone period during which all of exposure signals φA0 to φA2 are in a non-exposure period. FIG. 12 is a timing chart illustrating such exposure signals φA0 to φA2. The drawing illustrates the timings of irradiation light, reflected light, and exposure signals φA0 to φA2 and the exposure amounts, as in FIG. 9A. Exposure signals φA0 to φA2 may have overlapping exposure periods, as illustrated in FIG. 12. In this case, distance value Za can be calculated according to the following Expressions 7 to 12, depending on the magnitude relationship of exposure amounts A0, A1, and A2.

[Math. 4]

$$Za = \frac{c \cdot T_A}{6} \times \left(\frac{A2 - A1}{A2 - A0}\right) \quad A0 > A1 > A2 \quad \text{(Expression 7)}$$

$$Za = \frac{c \cdot T_A}{6} \times \left(1 + \frac{A1 - A0}{A1 - A2}\right) \quad A1 > A2 > A0 \quad \text{(Expression 8)}$$

$$Za = \frac{c \cdot T_A}{6} \times \left(2 + \frac{A0 - A2}{A0 - A1}\right) \quad A1 > A0 > A2 \quad \text{(Expression 9)}$$

$$Za = \frac{c \cdot T_A}{6} \times \left(3 + \frac{A2 - A1}{A2 - A0}\right) \quad A2 > A1 > A0 \quad \text{(Expression 10)}$$

$$Za = \frac{c \cdot T_A}{6} \times \left(4 + \frac{A1 - A0}{A1 - A2}\right) \quad A2 > A0 > A1 \quad \text{(Expression 11)}$$

$$Za = \frac{c \cdot T_A}{6} \times \left(5 + \frac{A0 - A2}{A0 - A1}\right) \quad A0 > A2 > A1. \quad \text{(Expression 12)}$$

Exposure amounts B0 and B2 can be calculated according to the following Expression 13.

[Math. 5]

$$B0=6\{\max(A0,A1,A2)-\min(A0,A1,A2)\}+B2 \quad \text{(Expression 13)}.$$

In exposure amounts A0, A1, and A2, the difference between the maximum signal and the minimum signal is always the exposure amount with a light emission period of 1T. Accordingly, exposure amount B0 can be calculated by multiplying it by the ratio to the light emission period in FIG. 10 or 11 and adding, to the multiplication result, exposure amount B2 corresponding to the background light component.

Regarding exposure amount B2 corresponding to the background light component, the following relationships of Expressions 14 and 15 hold, given that, in exposure amounts A0, A1, and A2, the sum of the maximum signal and the median signal is always an exposure amount for a light emission period of 2T and the sum of the minimum signal and the median signal is always an exposure amount for a light emission period of 1T.

[Math. 6]

$$\{\max(A0,A1,A2)+\text{median}(A0,A1,A2)\}=(\text{exposure amount for 2T})+2B2 \quad \text{(Expression 14)}$$

$$\{\min(A0,A1,A2)+\text{median}(A0,A1,A2)\}=(\text{exposure amount for 1T})+2B2 \quad \text{(Expression 15)}.$$

Exposure amount B2 can therefore be calculated according to the following Expression 16.

[Math. 7]

$$B2=\min(A0,A1,A2)-0.5\{\max(A0,A1,A2)-\text{median}(A0,A1,A2)\} \quad \text{(Expression 16)}.$$

Thus, TOF calculator 203 calculates, from the first imaging signal (respective raw data indicating A0, A1, and A2 in this embodiment), at least one of the offset component and the component of exposure to the whole reflected light (both components in this embodiment), and calculates distance value Zb using the at least one component and the second imaging signal (raw data indicating B1 in this embodiment).

In detail, in this embodiment, TOF calculator 203 calculates the component of exposure to the whole reflected light, from the difference between the maximum signal and the minimum signal of the respective raw data indicating A0, A1, and A2. TOF calculator 203 also calculates the offset component, from the difference between the sum of the maximum signal and the median signal of the respective raw data indicating A0, A1, and A2 and the sum of the minimum signal and the median signal. TOF calculator 203 then estimates, using the calculated offset component and component of exposure to the whole reflected light, the imaging signal (respective raw data indicating exposure amounts B0 and B2 in this embodiment) obtained according to the exposure signal (exposure signals φB0 and φB2 in this embodiment) that has the same exposure period as the second exposure signal group (exposure signal φB1 in this embodiment) and differs in delay time with respect to light emission signal φB. Thus, TOF calculator 203 estimates exposure amounts B0 and B2, and calculates distance value Zb from actually measured exposure amount B1 and estimated exposure amounts B0 and B2.

With such distance-measuring imaging device 200 according to this embodiment, too, the number of times folding occurs in the first distance value (Za in this embodiment) can be specified as in distance-measuring imaging device 100 according to Embodiment 1. This makes it possible to maintain distance measurement accuracy and widen the distance measurement range, with a reduced number of signals necessary for distance-measuring calculation.

In this embodiment, the second imaging signal (respective raw data indicating exposure amounts B0 and B2 in this embodiment) is estimated using the first imaging signal (respective raw data indicating exposure amounts A0 to A2 in this embodiment). This enables distance-measuring calculation to be performed simply by the exposure control according to exposure signal group A and the exposure control according to exposure signal φB1, without generating exposure signals φB0 and φB2 and detecting exposure amounts B0 and B2.

Here, TOF calculator 203 only needs to calculate at least one of the offset component and the component of exposure to the whole reflected light from the first imaging signal, and need not necessarily calculate both of the components.

(Other Embodiments)

Although a distance-measuring imaging device according to the present disclosure has been described by way of the foregoing embodiments and variations, a distance-measuring imaging device according to the present disclosure is not limited to the foregoing embodiments and variations. Other embodiments obtained by combining any structural elements in the foregoing embodiments and variations, modifications obtained by applying various changes conceivable by a person skilled in the art to the foregoing embodiments and variations without departing from the scope of the present disclosure, and various appliances including a distance-measuring imaging device according to the present disclosure are also included in the present disclosure.

For example, Embodiment 1 describes the case where i exposure signals (i is an integer of 2 or more) (three exposure signals φB0 to φB2 in this embodiment) constituting exposure signal group B having a dead zone period are a group of exposure signals that differ in delay time by 1/j of the light emission cycle of light emission signal φB (where j>i, j=5 in this embodiment). However, exposure signal group B having a dead zone period is not limited to signals with the above-mentioned relationship in delay time with respect to the light emission cycle.

Figure 13:
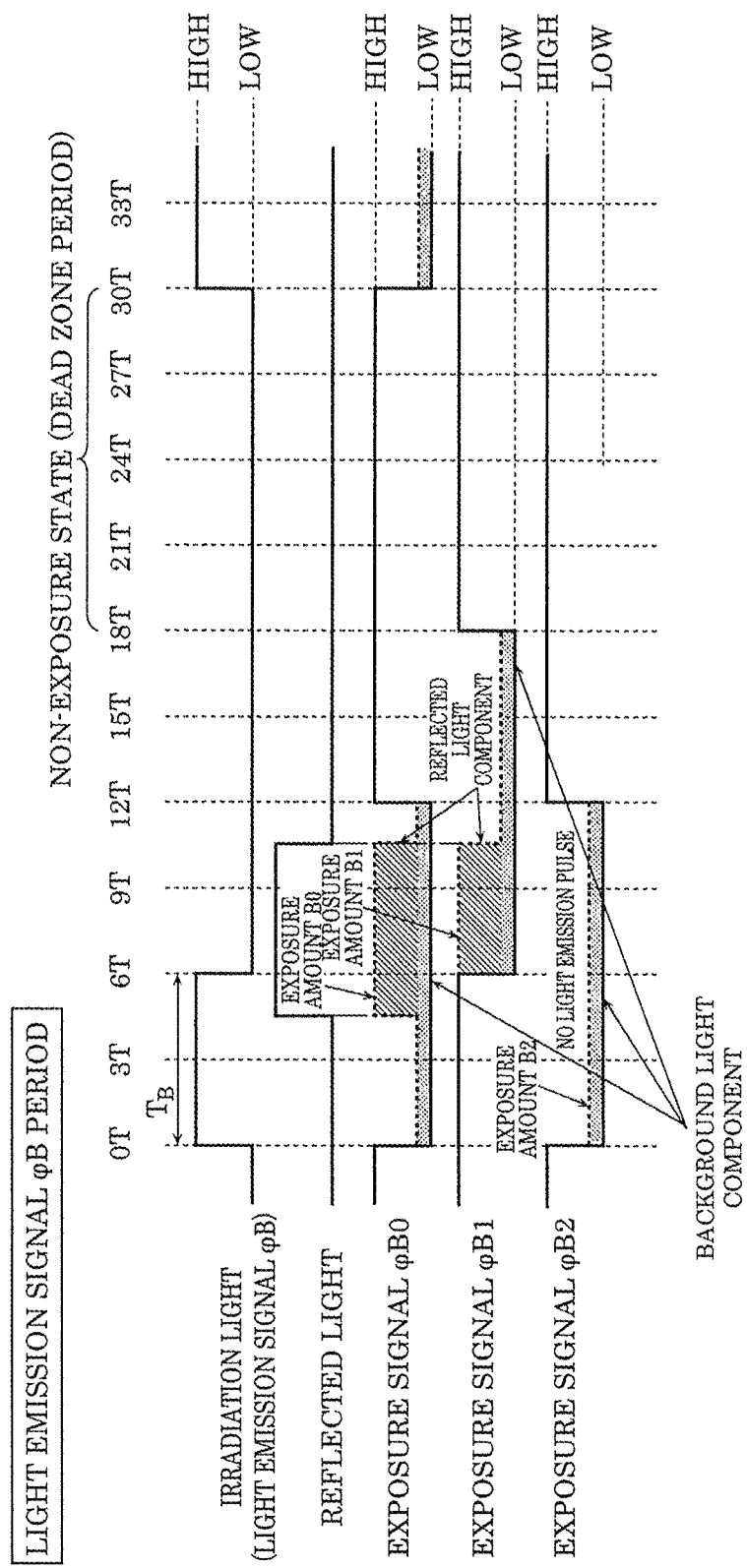
FIG. 13 is a timing chart illustrating an example of the operation of a distance-measuring imaging device according to another embodiment.

FIG. 13 is a timing chart illustrating such exposure signal group B. The drawing illustrates the timings of irradiation light (light emission signal φB), reflected light, and exposure signals φB0 to φB2, as in FIG. 4B. In the case where no light emission operation is performed by setting light emission signal φB to Low in the period during which an exposure signal (or signals) (exposure signal φB2 in this example) which is part of exposure signal group B is output, the delay time of the exposure signal may be 0 with respect to the time based on the assumption that the light emission signal is output, as illustrated in the drawing. In other words, in such a case, part of the plurality of exposure signals φB0 to φB2 constituting exposure signal group B may have the same delay time.

The present disclosure can be implemented not only as a distance-measuring imaging device, but also as a solid-state imaging device used in the distance-measuring imaging device as, for example, solid-state imager 2 or 2A. A solid-state imaging device according to the present disclosure is a solid-state imaging device used in a distance-measuring imaging device that measures the distance to an object by applying light to and receiving reflected light from the object. The distance-measuring imaging device includes a controller such as drive controller 4, light source 1, and a calculator such as TOF calculator 3 described above. The solid-state imaging device: performs exposure to the reflected light at timing indicated by each exposure signal in the first exposure signal group, and outputs the first imaging signal indicating an exposure amount corresponding to the first exposure signal group to the calculator; and further performs exposure to the reflected light at timing indicated by each exposure signal in the second exposure signal group, and outputs the second imaging signal indicating an exposure amount corresponding to the second exposure signal group to the calculator.

The use of such a solid-state imaging device in the distance-measuring imaging device makes it possible to maintain distance measurement accuracy and widen the distance measurement range with a reduced number of signals necessary for distance-measuring calculation, as with the distance-measuring imaging device described above.

The present disclosure can be implemented not only as a distance-measuring imaging device including these features, but also as a distance measuring method or a driving method of the distance-measuring imaging device.

The distance measuring method or the driving method of the distance-measuring imaging device includes: a first output step of cyclically outputting a first exposure signal group that is made up of a plurality of exposure signals different from each other in delay time with respect to the light emission signal and in which, before an exposure period of one exposure signal ends, an exposure period of at least one other exposure signal starts; a second output step of outputting a second exposure signal group that is made up of one or more exposure signals different from each other in delay time with respect to the light emission signal and that has a dead zone period during which all of the one or more exposure signals are in a non-exposure period; and a calculation step of calculating a first distance value using a first imaging signal obtained in the first output step, calculating a second distance value using a second imaging signal obtained in the second output step, and calculating the distance based on the first distance value and the second distance value.

With such a distance measuring method or driving method, too, it is possible to maintain distance measurement accuracy and widen the distance measurement range with a reduced number of signals necessary for distance-measuring calculation, as with the distance-measuring imaging device described above.

INDUSTRIAL APPLICABILITY

A distance-measuring imaging device according to the present disclosure is capable of highly accurate three-dimensional measurement of a measurement object regardless of surrounding environment, and so is useful, for example, for three-dimensional measurement of persons or buildings.

What is claimed is:

1. A distance-measuring imaging device that measures a distance to an object by applying pulse light to and receiving reflected light from the object, the distance-measuring imaging device comprising:
a controller that outputs a light emission signal and an exposure signal;
a light source that applies the pulse light at timing indicated by the light emission signal;
a solid-state imaging device that performs exposure to the reflected light at timing indicated by the exposure signal, and outputs an imaging signal indicating an exposure amount; and
a calculator that calculates the distance to the object using the imaging signal,
wherein the controller: cyclically outputs a first exposure signal group that is made up of a plurality of exposure signals different from each other in delay time with respect to the light emission signal and in which, before an exposure period of one exposure signal ends, an exposure period of at least one other exposure signal starts; and outputs a second exposure signal group that is made up of one or more exposure signals different from each other in delay time with respect to the light emission signal and that has a dead zone period during which all of the one or more exposure signals are in a non-exposure period,
the calculator calculates a first distance value using a first imaging signal obtained according to the first exposure signal group, calculates a second distance value using a second imaging signal obtained according to the second exposure signal group, and calculates the distance based on the first distance value and the second distance value,
the calculator calculates the second distance value, using the second imaging signal that has a smaller number of signals than the first imaging signal, and
the calculator: estimates, using the first imaging signal, an imaging signal obtained in the case where the controller outputs an exposure signal that has the same exposure period as each exposure signal in the second exposure signal group and differs from each exposure signal in the second exposure signal group in delay time with respect to the light emission signal; and calculates the second distance value using the estimated imaging signal and the second imaging signal.

2. The distance-measuring imaging device according to claim 1, wherein the calculator calculates the distance, using the number of times folding occurs in the first distance value, the number of times being specified using the second distance value.

3. The distance-measuring imaging device according to claim 1,
wherein the controller outputs, as the light emission signal, a first light emission signal that serves as a reference signal for a delay of each exposure signal in the first exposure signal group, and a second light emission signal that serves as a reference signal for a delay of each exposure signal in the second exposure signal group, and
the second light emission signal has a longer light emission period than the first light emission signal.

4. The distance-measuring imaging device according to claim 1, wherein the calculator: calculates at least one of an offset component and a component of exposure to the whole reflected light, from the first imaging signal; and calculates the second distance value using the calculated at least one component and the second imaging signal.

5. The distance-measuring imaging device according to claim 1, wherein the calculator calculates the second distance value, using only the second imaging signal from among the first imaging signal and the second imaging signal.

6. The distance-measuring imaging device according to claim 1, wherein the calculator performs a noise reduction filtering process on at least one of the first distance value and the second distance value, and calculates the distance using the at least one distance value after the noise reduction filtering process.

7. A solid-state imaging device used in a distance-measuring imaging device that measures a distance to an object by applying pulse light to and receiving reflected light from the object,
wherein the distance-measuring imaging device includes:
a controller that outputs a light emission signal and an exposure signal;
a light source that applies the pulse light at timing indicated by the light emission signal; and
a calculator that calculates the distance to the object,
wherein the controller: cyclically outputs a first exposure signal group that is made up of a plurality of exposure signals different from each other in delay time with respect to the light emission signal and in which, before an exposure period of one exposure signal ends, an exposure period of at least one other exposure signal starts; and outputs a second exposure signal group that is made up of one or more exposure signals different from each other in delay time with respect to the light emission signal and that has a dead zone period during which all of the one or more exposure signals are in a non-exposure period,
the calculator calculates a first distance value using a first imaging signal obtained according to the first exposure signal group, calculates a second distance value using a second imaging signal obtained according to the second exposure signal group, and calculates the distance based on the first distance value and the second distance value,
the solid-state imaging device: performs exposure to the reflected light at timing indicated by each exposure signal in the first exposure signal group, and outputs the first imaging signal indicating an exposure amount corresponding to the first exposure signal group to the calculator; and performs exposure to the reflected light at timing indicated by each exposure signal in the second exposure signal group, and outputs the second imaging signal indicating an exposure amount corresponding to the second exposure signal group to the calculator,
the calculator calculates the second distance value, using the second imaging signal that has a smaller number of signals than the first imaging signal, and
the calculator: estimates, using the first imaging signal, an imaging signal obtained in the case where the controller outputs an exposure signal that has the same exposure period as each exposure signal in the second exposure signal group and differs from each exposure signal in the second exposure signal group in delay time with respect to the light emission signal; and calculates the second distance value using the estimated imaging signal and the second imaging signal.

8. The solid-state imaging device according to claim 7, comprising:
   a charge coupled device (CCD) solid-state imaging element.

9. The solid-state imaging device according to claim 7, comprising:
   a complementary metal-oxide semiconductor (CMOS) solid-state imaging element.

10. The solid-state imaging device according to claim 7, being included in one chip together with the controller and the calculator.

\* \* \* \* \*